United States Patent [19]
Smith

[11] Patent Number: 5,296,673
[45] Date of Patent: Mar. 22, 1994

[54] LASER MACHINING

[75] Inventor: Nicholas J. G. Smith, Wiltshire England

[73] Assignee: Raychem Limited, London, England

[21] Appl. No.: 820,903

[22] PCT Filed: Jul. 12, 1990

[86] PCT No.: PCT/GB90/01071
§ 371 Date: Jan. 14, 1992
§ 102(e) Date: Jan. 14, 1992

[87] PCT Pub. No.: WO91/01514
PCT Pub. Date: Feb. 7, 1991

[30] Foreign Application Priority Data
Jul. 14, 1989 [GB] United Kingdom ............... 8916133.5

[51] Int. Cl.$^5$ ............................................ B23K 26/18
[52] U.S. Cl. ............................ 219/121.68; 219/121.75
[58] Field of Search ...................... 219/121.68, 121.69, 219/121.75

[56] References Cited

U.S. PATENT DOCUMENTS

| | | | |
|---|---|---|---|
| 4,508,749 | 4/1985 | Brannon et al. | 427/43.1 |
| 4,780,177 | 10/1988 | Wojnarowski et al. | 219/121.69 X |
| 4,801,068 | 3/1989 | Shimazu et al. | 350/358 |
| 4,907,341 | 3/1990 | Chapel, Jr., et al. | 219/121.69 X |
| 5,095,190 | 3/1992 | Aketagawa et al. | 219/121.78 |

Primary Examiner—C. L. Albritton
Attorney, Agent, or Firm—Herbert G. Burkard

[57] ABSTRACT

Apparatus for excimer laser image protection ablation of a target material comprising a projection lens system for projecting a mask pattern to be ablated onto the target, which lens system is telecentric towards the image (target) end of the projection path, and means for moving the target along the projection path whereby in use the size of the projected image areas to be ablated from the target is adjusted substantially without altering their relative portions of the target.

6 Claims, 1 Drawing Sheet

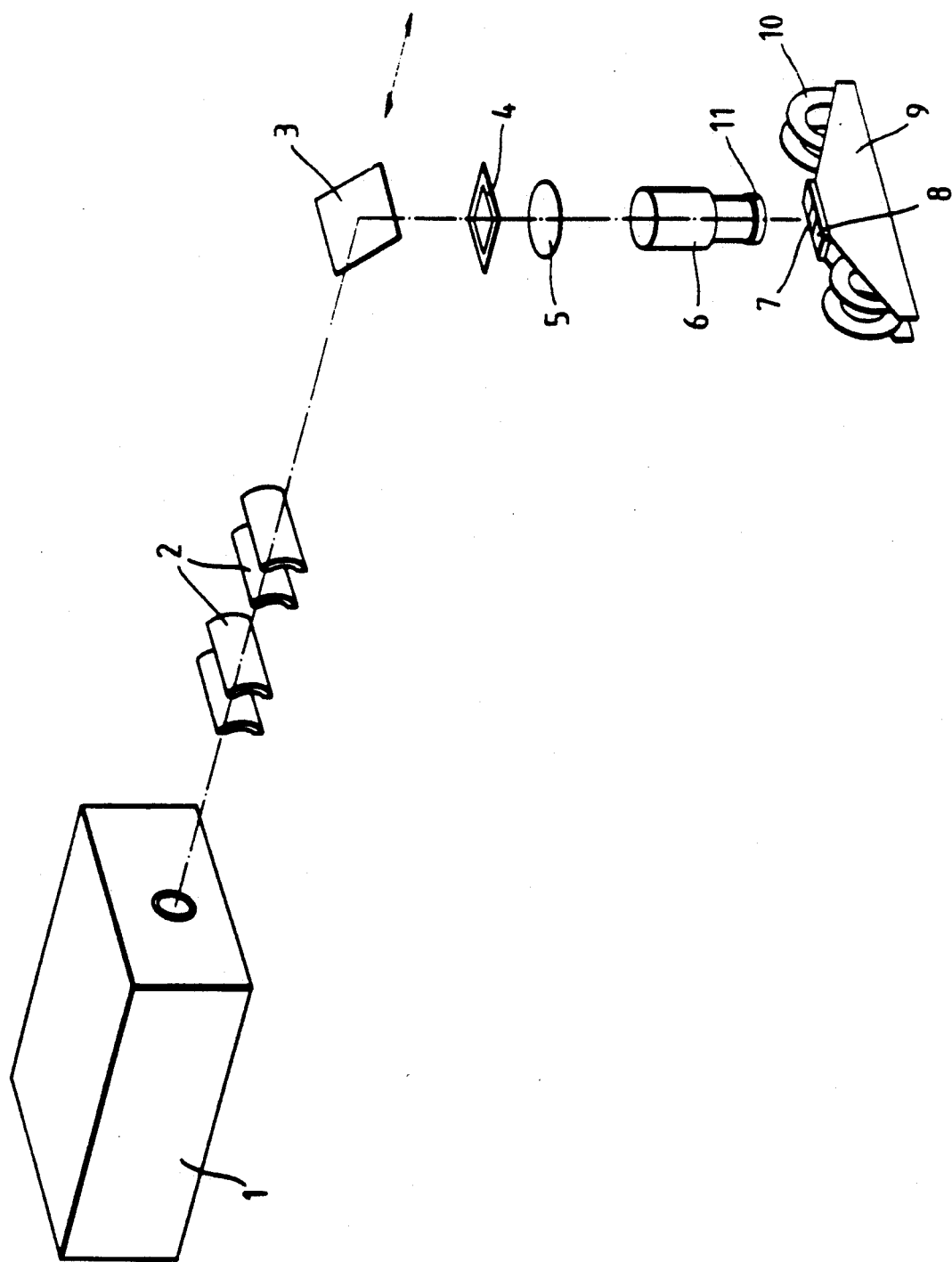

LASER MACHINING

This invention relates to apparatus and methods for laser ablation machining by projection imaging using an excimer laser.

Such projection imaging is known, for example from U.S Pat. No. 4508749, which describes excimer laser ablation etching of thin (5 micrometer) polyimide layers on microelectronic integrated circuit devices. The ultraviolet light from an excimer laser passes through a mask into a telecentric lens system which projects a reduced size image of the mask onto the 5 micrometer target layer of polyimide, thereby photoetching openings corresponding to the mask pattern in the polymide layer with a 55° to 60° slope on the sidewalls of the openings.

The present invention provides a system which is particularly well suited to producing through-holes in thicker polymer films, preferably self-supporting films, as described for example in EP-A-0213774 or in copending International Applications PCT/GB89/00110, PCT/GB89/00111, PCT/GB89/00108, and PCT/GB89/00109. Other uses of the system according to the present invention can be envisaged and are not excluded.

One aspect of the present invention provides an apparatus for excimer laser image projection ablation of a target material comprising a projection lens system for projecting a mask pattern to be ablated onto the target, which lens system is telecentric towards the image (target) end of the projection path, and means for moving the target along the protection path whereby in use the size of the projected image areas to be ablated from the target is adjusted substantially without altering their relative positions on the target. The de-magnification remains substantially unchanged, due to the telecentricity of the lens system, and the slightly diffuse focus on moving the target away from the true image plane leads to larger images of the mask apertures being formed, surprisingly without unacceptable loss of definition in the ablated pattern. It has been found, for example, that the target can be moved tens or even hundreds of micrometers away from the nominal focal plane of a telecentric lens whilst maintaining accurate centre-to-centre spacing and acceptable resolution of ablated features. Resolution of, for example, less than or equal to 2 micrometers can be achieved, and this is assisted by the non-linearity of ablation depth in proportion to applied fluence, which tends to suppress ablation in diffuse image areas where the fluence falls below the threshold for ablation.

Preferably the multi-elements lens system is telecentric only on the image (target) side, so that movement of the mask object along the optical axis can be used to alter the de-magnification slightly, for example within a range from 4.9:1 to 5.1:1, thus slightly altering the aperture spacing in the image to fit various end use requirements. In this way, for example, patterns may be machined in polymer films with dimensions "tailored" to allow for thermal expansion, without the need to fabricate a new mask. By combining both the mask and target adjustment great versatility can be achieved.

In another aspect of the invention, to cover larger areas, the projected image may be "stepped and repeated" across the target by mounting the target on a moveable stage (provided the image has a repeat pattern), or the beam may be scanned, preferably by deflection using a mirror which is moved linearly to translate the laser beam across the surface of a mask which is larger in area than the beam emanating from the excimer laser. Alternatively, the mirror could be rotated slightly to scan the beam through a small angle, or a triangular acute-angled quartz prism could be rotated to scan the beam passing through it by altering the refraction angles. Scanning of the beam in that one of its directions which has an approximately Gaussian intensity distribution tends to homogenise the beam with advantageous results in uniformity of ablation. The beam can be scanned in two dimensions by combining (for example) a scanning mirror and a prism.

Another aspect of the invention is that the shape of the beam may advantageously be altered, e.g to extend its width, and the original fluence can be retained if desired or may be increased or decreased, by correspondingly altering the other dimension (e.g to reduce its height) of the beam. Cylindrical lenses may, for example, be used so to alter the beam shape. Such alterations of the beam shape may be especially useful with the scanning features mentioned above.

A further aspect of the present invention unusually uses a mask pattern of highly reflective material, preferably reflective chrome metal, on a U.V.-transparent sheet, preferably fused quartz. Reflective masks are usually avoided to prevent reflections forming ghost images, but in the present ablation system it is found that the ghost images are not detrimental, being below the threshold fluence for ablation. On the other hand, ghost images in U.V. cross-linking systems such as photoresists have a cumulative cross-linking effect which is not acceptable. The use of U.V.-reflective masking material on a U.V.-transparent support has the great advantage of reducing U.V. absorption damage to the expensive high-precision masks.

In preferred aspects of the present invention, a desired level of resolution (e.g less than or equal to 2 micrometers) together with a preferred distortion (e.g. less than 2 micrometers over a 15 mm image field) together with a preferred depth of focus (e.g. more than 15 micrometers), at a linear demagnification of 5:1, is achieved with a minimum number of optical elements in order to maximise the proportion of the laser light transmitted to the target. The aforementioned non-linearity of ablation depth helps this by sharpening the edges of the ablated pattern without the need for additional optical elements to correct aberration at the edges of the image. It is also preferred to use a reflection-reducing coating on the lens elements, preferably in the aforementioned telecentric lens system. At least 80% transmission to the target is preferable and 85% or more has been achieved in this way. A preferred coating material is collodial silica with a refractive index (at 249 nm) of about 1.5.

Another aspect of this present invention is that the beam area of a given excimer laser can be decreased to increase the delivered fluence per unit area, using (for example) cylindrical lenses. This has the effect of decreasing the slope of the sidewalls in the polymer openings, but the number of laser pulses or "shots" required to ablate a given target area does not always decrease with the increasing fluence. This is because the decreasing beam area can eventually become less than the target area, thus requiring stepping or scanning, resulting in an increase in the required number of pulses. Thus, the beam area and fluence can be selected to minimise the number of shots required, so prolonging the laser life. For ablation drilling of holes through polymide films of thickness greater than 8 micrometers, preferably greater than 25 micrometers, for example greater than 50 or 100 micrometers, up to 500 or 800 micrometers, over areas greater than 2 mm², a preferred fluence to minimise the number of shots is 2.5 to 3 times the ablating threshold fluence of the target material.

In another aspect of the invention, the fluence applied to the target is selected to be sufficient to "blow" the debris out of the ablated pattern. It has been discovered that (for example) when ablating through-holes of about 35 micrometers diameter in a polyamide-polymide-polyamide laminate as described in PCT/GB89/00109 of about 100 micrometers thickness, a fluence of at least 3 joules/cm²/pulse is preferred. Thus the preferred laser fluence at the target depends on the parameter to be optimised for a given application: wall angle, laser lifetime or retained debris. Beam shaping (for example by cylindrical lenses) is particularly useful to allow flexibility of operation.

The pulse frequency should preferably exceed the minimum necessary to achieve full uniform coverage of the target area as the beam is scanned thereover. Preferably the pulse rate will be such relative to the scan-rate that the projected pulses meet at their edges or overlap slightly on the target surface.

Another preferred aspect of the invention is protection of the lens element nearest the target from the ablated debris. This may be achieved by designing the reduction less so that the target is as far as possible from the lens, but preferably also involves the provision as the final element of the reducing lens of a replaceable layer, preferably a cheap U.V.-transparent planar quartz sheet, between the target and the lens to collect the debris. This feature of the invention has advantages of simplicity over complex electrostatic or vacuum systems.

A further aspect of the invention that facilitates drilling of through-holes in free-standing polymer films is the use of a support for the target which support is substantially non-reflective or only diffusely-reflective (to avoid damaging reflection back onto the reverse side of the target) and is either substantially non-absorptive or is cooled to avoid heating which could damage the targets. Preferably the support comprises frosted quartz for transmission without absorption of the U.V. light arriving through the target. This frosted quartz support may be provided with an array of small holes, so that vacuum may be used to hold the polymer film still during ablation. An absorber is preferably provided below the target support and is arranged to keep the absorption heat from damaging the target.

KrF excimer lasers producing light at a wavelength of about 249 nm are preferred for ablation of polyimide targets and, especially for ablation drilling holes of 1-250, preferably 10 to 200, e.g 25 to 100 micrometers diameter over an area of 0.1 to 10 square centimeters in the aforementioned polyamide-polymide-polyamide laminates, as described in co-pending application PCT/GB89/00108. Excimer lasers producing other wavelengths may be used, although the choice of optical materials becomes limited at wavelengths below 200 nm. Linear demagnification of 5:1 from the mask through the lenses to the on-target image of the mask is preferred for ablating the apertures in those laminates, although other demagnifications could be used for example ranging from 1:1 to 10:1. Resolution of 1 to 10 micrometers, preferably about 2 micrometers, and distortion of only 1 to 30, preferably about 2, micrometers at full image field are preferred.

A suitable projection lens system is described in U.S. Pat. No. 4,508,749, although other lens systems are not excluded.

An example of the present invention will now be described with reference to the accompanying drawings, showing many of the inventive aspects in combination. It will be understood, however, that the described aspects individually and other combinations of any two or more of the described aspects are included in the invention.

BRIEF DESCRIPTION OF THE DRAWINGS

Referring to the drawing, the system show schematically comprises a KrF excimer laser 1 producing pulsed laser light at a wavelength of about 249 nm which passes through beam-shaping and fluence-control cylindrical lenses 2 to a scanning mirror 3. The scanning mirror 3 is moved to and fro in the direction indicated by the two-headed arrow by means not shown to scan the shaped beam over the whole area of a mask 4 defining the pattern to be ablated. The mask comprises a pattern of reflective chromium metal on a U.V.-transparent quartz sheet. The laser fluence at the mask depends on the laser pulse energy and the beam shape (as selected by the cylindrical lenses). At any rate, it will be much less than the fluence at the target (if a reducing main lens is used) so mask damage is minimised (particularly if highly reflective chrome metal is used as the mask material.

A field lens 5 transmits the scanned image of the mask to the main reduction lens 6. The lens elements are made of synthetic fused silica and have the aforementioned reflection-resistant coating (not shown) to maximise transmission of the laser beam. A 5:1 linear reduction or de-magnification provides a 25:1 decrease in the image area and a corresponding increase in intensity to a fluence, which is capable of ablating the mask pattern into a polymeric target with commercially acceptable efficiency.

A polyamide-polyimide-polyamide laminate target (not shown) punched into 35 mm tape format of the kind hereinbefore described is held flat on a frosted silica support 7 which is in turn supported on a U.V. absorptive heat sink 8, and this in turn is carried on a support 9 which houses film feed and wind-ups means 10 to produce a series of ablation patterns in a strip of the laminate. All of this is attached to positioning means (not shown) for moving the target on the X, Y and Z axes and for rotating it in the plane of the support surface (i.e. rotating about the vertical Z axis), all in steps down to about 1 micrometer, reproducible to an accuracy of about 0.1 micrometer. This allows patterns to be step-and-repeated. Since the reduction lens 6 is telecentric toward the target, the vertical movement on the Z axis can be used in the method hereinbefore mentioned of altering the size of circular apertures to be ablated in the target without altering their relative centre-to-centre spacing. The mask 4 can be moved along the optical axis by means not shown at the non-telecentric end of the lens system to provide a method of altering the image size and thus the spacing of the apertures.

A removeable planar quartz sheet 11 is provided to protect the lower reduction lens surface from the ablated debris ejected from the target during processing.

A laser pulse-rate of about 100 Hertz is preferable. Lasers capable of delivering much higher rates, e.g.

1000 Hertz are generally unsuitable for the preferred purposes of the present invention.

I claim:

1. Apparatus for ablation excimer laser image projection ablation of a target material and comprising a projection lens system for projecting along a projection path a mask pattern to be ablated onto the target, said lens system being telecentric towards the image (target) end of the projection path, and means for moving the target along projection path whereby in use the size of projected image areas to be ablated from the target is adjusted substantially without altering the relative positions of said image areas on the target.

2. Apparatus according to claim 1 wherein the lens system is telecentric only towards the said image end, and movement of the mask along the projection path between the light source and the lens system in use adjusts the size of the projected mask image as a whole.

3. An excimer laser image projection ablation apparatus having a projection lens system for projecting along a projection path a mask pattern to be ablated onto a target, a means for moving the target along the projection path whereby in use the size of projected image areas to be ablated from the target is adjusted substantially without altering the relative positions of said image areas on the target, and a support for the target which support is substantially non-absorptive and only diffusely reflective of the laser light falling thereon in use.

4. Apparatus according to claim 3 wherein the support comprises frosted quartz.

5. Apparatus according to claim 3, having an absorber for the light passing through the support, the absorber arranged to avoid unacceptable heating of the target.

6. Apparatus according to claim 4, having an absorber for the light passing through the support, the absorber arranged to avoid unacceptable heating of the target.

* * * * *